United States Patent [19]
Potier et al.

[11] Patent Number: 5,090,244
[45] Date of Patent: Feb. 25, 1992

[54] SYSTEM FOR DETECTING FREE PARTICLES IN A COMPONENT HOUSING AND DETECTION METHOD

[75] Inventors: Daniel Potier, Soissons; Jean Gruau, Chatou; Albert Lecrivain, Bretigny S/Orge, all of France

[73] Assignees: Thomson-CSF, Puteaux; Le Centre National D'Etudes Spatiales, Paris, both of France

[21] Appl. No.: 465,069

[22] PCT Filed: Jun. 5, 1989

[86] PCT No.: PCT/FR89/00281
  § 371 Date: Jan. 31, 1990
  § 102(e) Date: Jan. 31, 1990

[87] PCT Pub. No.: WO89/12379
  PCT Pub. Date: Dec. 14, 1989

[30] Foreign Application Priority Data
  Jun. 3, 1988 [FR] France ................. 88 07403

[51] Int. Cl.$^5$ .................... G01H 1/00; G01M 7/02
[52] U.S. Cl. .................................. 73/572; 73/663
[58] Field of Search ................. 73/572, 663, 665

[56] References Cited

U.S. PATENT DOCUMENTS

| | | | |
|---|---|---|---|
| 3,534,589 | 10/1970 | Gibbons et al. | 73/572 |
| 3,916,677 | 11/1975 | Isley et al. | 73/669 |

FOREIGN PATENT DOCUMENTS

| | | | |
|---|---|---|---|
| 55-29753 | 3/1980 | Japan | 73/572 |
| 55-29754 | 3/1980 | Japan | 73/572 |
| 2108774 | 5/1983 | United Kingdom . | |

*Primary Examiner*—John E. Chapman
*Attorney, Agent, or Firm*—Oblon, Spivak, McClelland, Maier & Neustadt

[57] ABSTRACT

System for detecting free particles in component housings assembled on a printed-circuit card, according to which the card is made integral with a vibrating frame by a pneumatic mechanism. A removable piezo-acoustic sensor makes it possible to test for the presence of free particles in one or more of the component housings.

16 Claims, 5 Drawing Sheets

SYSTEM FOR DETECTING FREE PARTICLES IN A COMPONENT HOUSING AND DETECTION METHOD

BACKGROUND OF THE INVENTION

1. Field of the Invention

The invention relates to a system for detecting free particles in a component housing and to its detection method.

2. Discussion of the Background

The principle of searching for particles in the housings of individual electronic components is known in the art. It is put into practice, at the present time, by the piezo-acoustic detection of the impacts which these particles generate on the walls of the housing when the component is subjected to a vibration of appropriate amplitude and frequency Appliances which generate a sequence of shocks (to free possibly "wedged" particles) and which provide standardized detection periods have been on the market for several years. Particles of a mass of $10^{-6}$ gram can be detected by this method.

This method is, above all, a means for improving the production processes for components; but it is also the last stage in combatting pollution which may be dangerous for the proper functioning of the component and which is generated or trapped during the closing of its housing.

This test is often required for components to be used in space. However, it is carried out before the components are assembled on printed-circuit boards.

When the components are mounted on printed-circuit cards, it becomes difficult to conduct such a test because of the risks of damage to the card during this handling.

The identification of components polluted by particles and assembled on a fully equipped printed card becomes expedient from the moment before one of these components has been involved in a failure process.

It becomes necessary when:
this pollution is found to be of metallic origin,
there is sufficient probability of the presence of an identical source of pollution in the rest of the batch of components,
the function performed in the equipment necessitates exceptional reliability,
the time and financial resources for producing one or more new cards are not available.

The test of components already assembled on printed-circuit cards is made difficult because:
the equipped cards are of different formats,
the cards are difficult to hold mechanically,
the components involved are in metal housings of the type TO99 (8.2 mm in diameter and 4 mm high), and access to some of them is difficult,
the cards are lacquered on both sides,
no mechanical, physical or chemical deterioration of the cards is acceptable,
the detection of the polluted components must
it must be easy for the system as a whole to be used within an industrial context.

SUMMARY OF THE INVENTION

The subject of the invention is a system allowing such a test and avoiding any risk of physical, mechanical or chemical deterioration of the card and its components.

The invention therefore relates to a system for detecting free particles in one or more component housings which are assembled on a printed-circuit card, comprising:
a vibrating stage;
vacuum-generating means fixed to the vibrating stage, carrying the printed-circuit card on one of its faces and holding this card in position as a result of the generated vacuum;
at least one piezo-acoustic detector which can be coupled acoustically to one or more components.

The invention also relates to a method for detecting free particles in one or more components assembled on a printed-circuit card, involving the following steps:
holding the printed-circuit card on a vibrating stage by the generation of a vacuum between the card and the vibrating stage;
measuring possible sound impacts on the walls of each component by the acoustic coupling of at least one piezo-acoustic detector to one or more components.

BRIEF DESCRIPTION OF THE DRAWINGS

The various subjects and characteristics of the invention will emerge more clearly from the following description given as an example with reference to the accompanying figures wherein.

DESCRIPTION OF THE PREFERRED EMBODIMENTS

The original basic idea of the system resides in holding of the cards and of the piezo-acoustic sensor by means of a vacuum.

Figure 1:
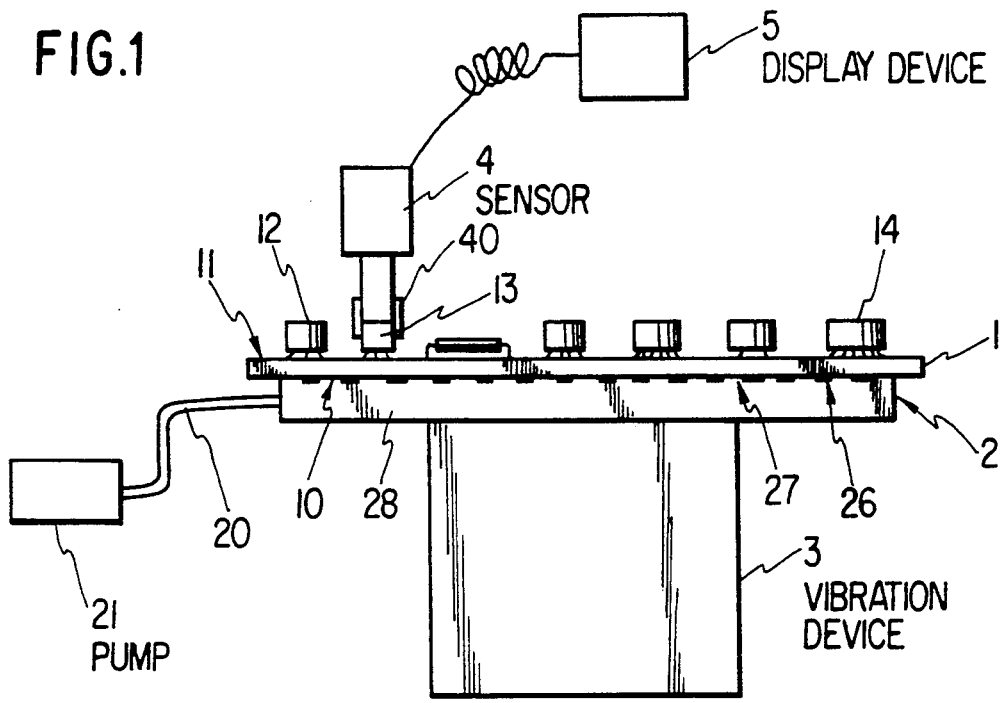
FIG. 1 shows a simplified exemplary embodiment of the detection system of the invention.

FIG. 1 illustrates the system of the invention in simplified form.

This system comprises a vibrating device 3, to which is fastened a hollow plate 2 having an access 20, via which a pump 21 can generate a vacuum in the cavity 28 of the plate A printed-circuit card 1 carrying on its face 11 components 12, 13, 14 to be tested is laid with its face 10 against the wall 26 of the plate 2. Orifices 27 in the plate are provided in the wall 26 of the plate 2. These orifices make it possible, when a vacuum is generated in the plate 2, to lay the card 1 onto the plate 2 by suction A pump 21 connected to an access 20 of the plate provides this vacuum.

Furthermore, a piezo-acoustic sensor 4 can be coupled acoustically to a component 13 by coupling means 40. This sensor 4 in contact with the upper face of the component 13 detects the sound impacts generated in the component and in exchange supplies an electrical signal to a processing and display device 5.

Such a system functions as follows
the plate 2 is fastened to the vibrating device 3;

the printed-circuit card is placed with its face 10, which has no components, against the wall 26 of the plate;

the pump 21 generates a vacuum in the cavity 28 of the plate, the effect of which is to suck the card 1 via the orifices 27 and lay it against the wall 26;

a piezo-acoustic sensor 4 is then applied successively to each component to be tested, such as 13, so as to detect the presence in these components of free particles which strike the inner walls of the covers of the components under the effect of the vibrations. The presence of free particles in the components can be detected in this way.

the vibrating device 3 is put into operation and causes the plate 2 and the card 1 to vibrate.

Furthermore, before the measurement is made by means of the sensor 4, it is possible to impart one or more shocks to the component to be tested, in order to detach a particle which may be stuck or wedged in the housing. For this purpose, this shock or these shocks can be communicated, for example, by means of the sensor 4.

Figure 2:
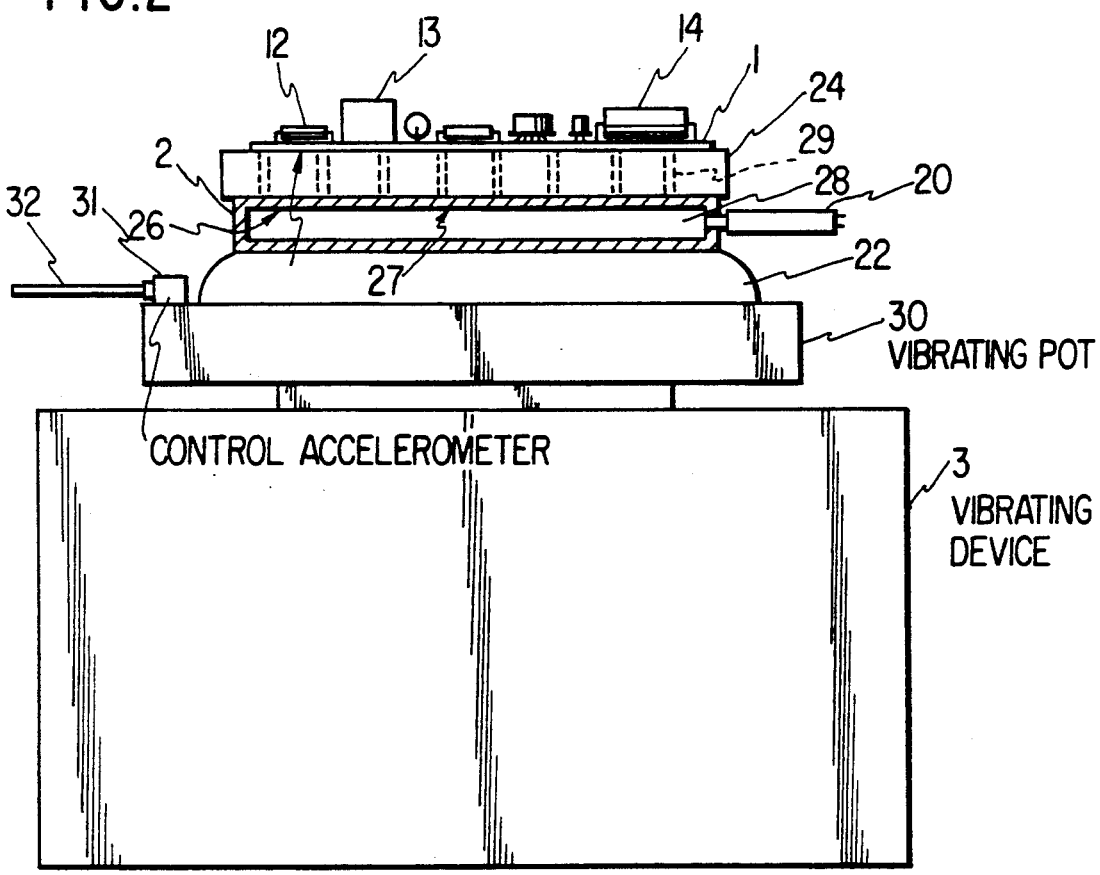
FIG. 2 shows a detailed exemplary embodiment of the system according to the invention for the pneumatic fastening of a card to be tested.

Referring to FIG. 2, a detailed exemplary embodiment of the device making it possible to hold the printed-circuit card 1 on the vibrating device 3 will now be described.

The vibrating device 3 possesses an exciting stage 30 subjected to the vibrations. Mounted on this stage is a control accelerometer 31 making it possible to measure the vibrations and return a control signal to the vibrating device 3 by means of a connection 32, in order to adjust the characteristic of the vibrations.

The plate 2 is retained on the stage 30 by means of a deformable mastic which has the property of transmitting vibrations and which will be described later.

As in FIG. 1, the plate 2 has a cavity 28, an access 20 making it possible to generate a vacuum in the cavity 28, and an upper wall 26 possessing orifices 27. The upper wall 26 can simply be a perforated cover of the plate 2.

A pad 24 made of soft material and having holes 29 is placed on the wall 26. These holes 29 communicate with orifices 27 of the wall 26.

The printed-circuit card 1 is placed on the pad 24, with its face 10 not having any components in contact with the pad 24. The holes 29 in the pad 24 are arranged so as not to correspond to holes in the card 1.

It should be noted that the system can also operate with components on the face 10 having components.

Thus, when a vacuum is to be generated in the cavity 28, the printed-circuit card will be laid against the pad 24. The card 1, pad 24, plate 2, mastic 22 and exciting stage 30 will therefore constitute an integral assembly. The vibrations of the stage will be transmitted to the card 1, without any disturbing noises attributable to mechanical shocks.

The various elements of the system so described will now be described in detail.

Figure 3:
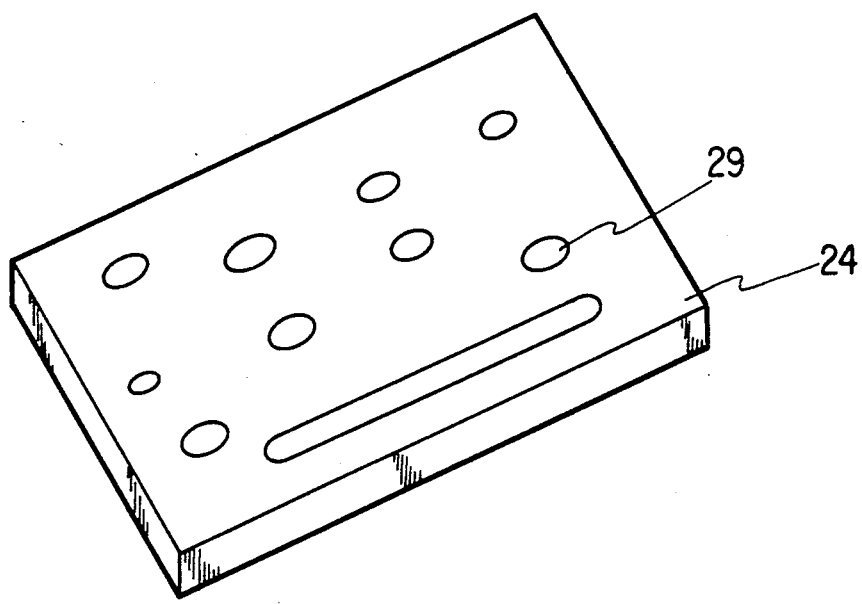
FIG. 3 shows an exemplary embodiment of a pad made of soft material.

As has been described, the printed-circuit card is placed on a pad 24 of polymer foam (FIG. 3) with closed cells 29, which is pierced with a sufficient number of holes 29, avoiding the metallized holes and the holes for the fastening and passage of the collars of the card undergoing testing. This foam pad rests on a plate 2 connected to the pump 21 and is fastened to the head of the vibrating pot 30 by means of a layer of sealing mastic 22. A rigid device can be substituted for the mastic. A different card simply requires a differently pierced foam pad and sometimes a different plate 2.

Holding the card therefore requires no clamping which would risk damaging the card and which would have to be specific to the particular card (especially to its format). Moreover, any clamping by grippers and some other device generates noise.

The sealing mastic of the type known in the trade by the name of BOSTIK faithfully transmits shocks and accelerations. The plasticity of this sealing mastic makes it easier to use. Furthermore, it was demonstrated that it considerably attenuated the impact wave propagated towards the adjacent components; the discrimination of a polluted component is therefore easy. This discrimination function is performed, here, by the elastic foam which is easier to use.

The elastic foam mates with the roughnesses of the back of the card (nuts, soldered joints, collars, etc.), without adversely affecting sealing of the assembly; it distributes the acceleration force uniformly over the card, thus limiting possible resonances; it makes the system independent of the method of mechanical fastening of the cards; when compressed, and it faithfully transmits the vibration of the exciter. It does not have to generate electrostatic charges. The plate 2 is grounded.

Thus, with such a system, the vacuum is calculated as a function of the area of the card, its mass and the maximum applied acceleration.

Figure 4:
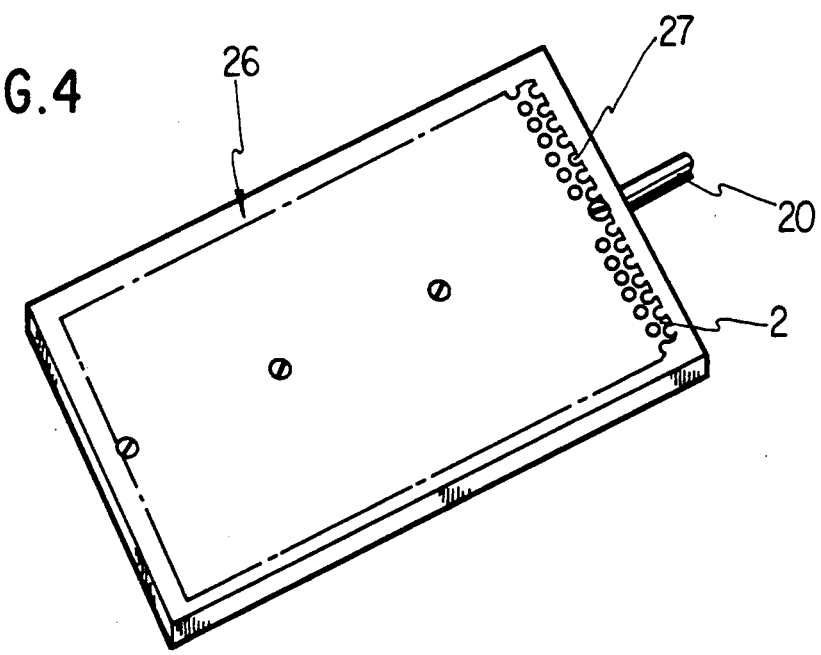
FIG. 4 shows a hollow plate for the suction of a card.

The plate 2 can be produced, as shown in FIG. 4, in the form of a dish closed by means of a cover 26 having perforations 27.

The piezo-acoustic sensor detecting the impacts of the particles has sufficient sensitivity, but its excessive size, the proximity of adjacent components, the layer of heterogeneous surface lacquer and the unsuitability of the adhesives makes it impossible for it to be laid directly on the top of the component It was therefore necessary to resort to using as light an adaptor as possible, but which is of appropriate sound impedance, and transmitting the impacts without any appreciable weakening, shocks were imparted to the component in order to dislodge the particles After various tests, a titanium adaptor was decided to be used.

The sensor is moved simply by cutting off the vacuum, without excessive stress being exerted on the component. The mastic 22 can thus transmit vibrations to the equipment housing while absorbing acoustic waves caused by free particles that may be in the housing.

Figure 5:
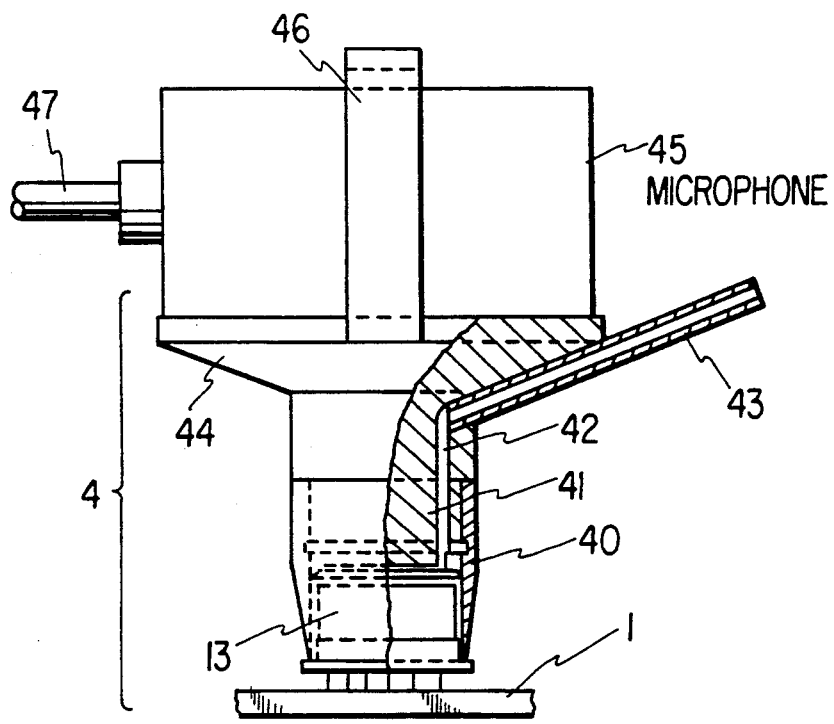
FIG. 5 shows a detailed exemplary embodiment of a piezo-acoustic sensor adaptable to a component.

FIG. 5 illustrates an exemplary embodiment of a piezo-acoustic sensor and its mounting on a component.

FIG. 5 therefore once again shows the card 1 with a component 13.

The sensor comprises a piezo-acoustic microphone 45 fixed to a metal adaptor 44. Since this microphone 45 is of a size markedly larger than the size of a component to be tested, an adaptor piece 41 is fastened at one end to the adaptor 44, whilst the other end is intended to be put in contact with the component which has dimensions compatible with that of component 13.

Figure 6:
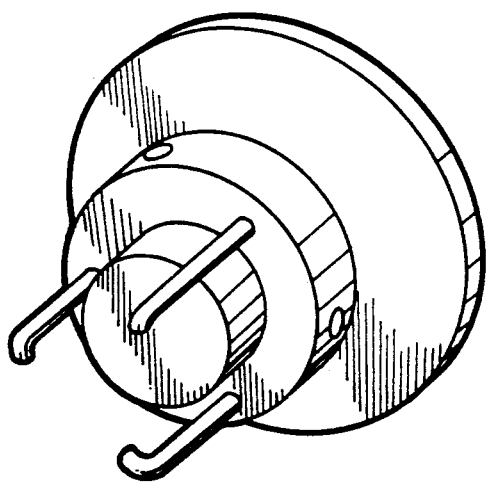
FIGS. 6 and 7 show exemplary embodiments of an adaptor piece for components.

An adaptor piece 41 can be used which has claws, as shown in FIG. 6, for fastening to the component to be tested.

Figure 7:
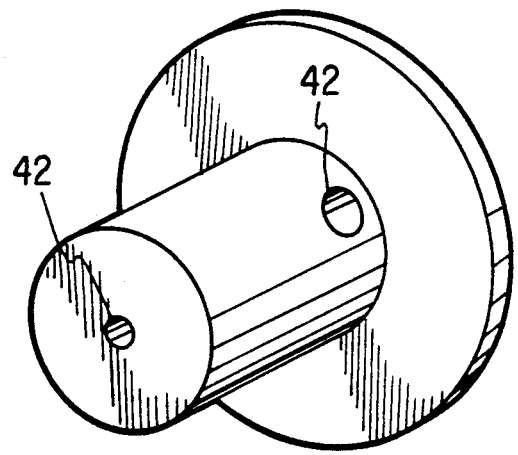

As shown in FIG. 7, it can equally possess an inner duct 42 which is seen to open out, on the one hand, onto the periphery of the adaptor piece and, on the other hand, at the end intended to be in contact with the component to be tested. This type of adaptor piece is the one used with the sensor of FIG. 5.

The adaptor piece 41 is placed on the upper face of the component 13. A sealing flange or skirt 40 is arranged round the component and the adaptor piece. This skirt seals off in a leakproof manner the interface located between the component and the adaptor piece. By the generation of a vacuum in this interface via the duct 42 of the adaptor piece and via the pumping pipe 43 connected to the duct, the adaptor piece comes in contact with the component. The pumping pipe 43 is preferably a flexible pipe, to allow the sensor to be moved from one component to another and allow vertical oscillatory movement attributable to the vibrations of the vibrating device 3.

It should be noted, although this is not shown in the figure, that the mechanical and acoustic connections between the component and the adaptor piece 41, between the adaptor piece 41 and the adaptor 44 and between the adaptor 44 and the microphone 45 can be made by means of an ultrasonic coupler.

Experience has shown that the solid nature of the adaptor piece 41 is of primary importance for the transmission of the impact wave. Its head is machined so as to mate as closely as possible with the cover of the component. The gaps are filled with a viscous ultrasonic coupler (such as is known by the name of AC.V9 ENDEVCO). The rubber skirt forming the cavity under a vacuum is sufficiently flexible to absorb the irregularities of the lacquer, without impairing the sealing. This vacuum keeps the adaptor permanently in contact (it has been shown that the lacquer transmits the impact wave).

The sensor possesses, furthermore, a bracket 46 making it possible to impart shocks to the component so as to detach particles wedged or stuck in the housing.

The sensor is connected electrically to measuring circuits by means of a connection 47 and transmits the acoustic signals detected to them. These measuring circuits comprise a chain allowing amplification and filtering and acoustic and visual-display indicators.

In the course of measurement, the least amount of leakage in the region of the card and the adaptor is detected "noisily" (this is one of the primary uses of piezo-acoustic sensors) because continuous noise is generated. Likewise, the noises (contacts, cables, etc.) synchronous with the excitation are easily detectable.

The system consisting of the device of FIG. 2 and of the sensor of FIG. 5 forms an assembly which thus makes it perfectly possible to conduct tests on components assembled on a printed-circuit card.

Figure 8:
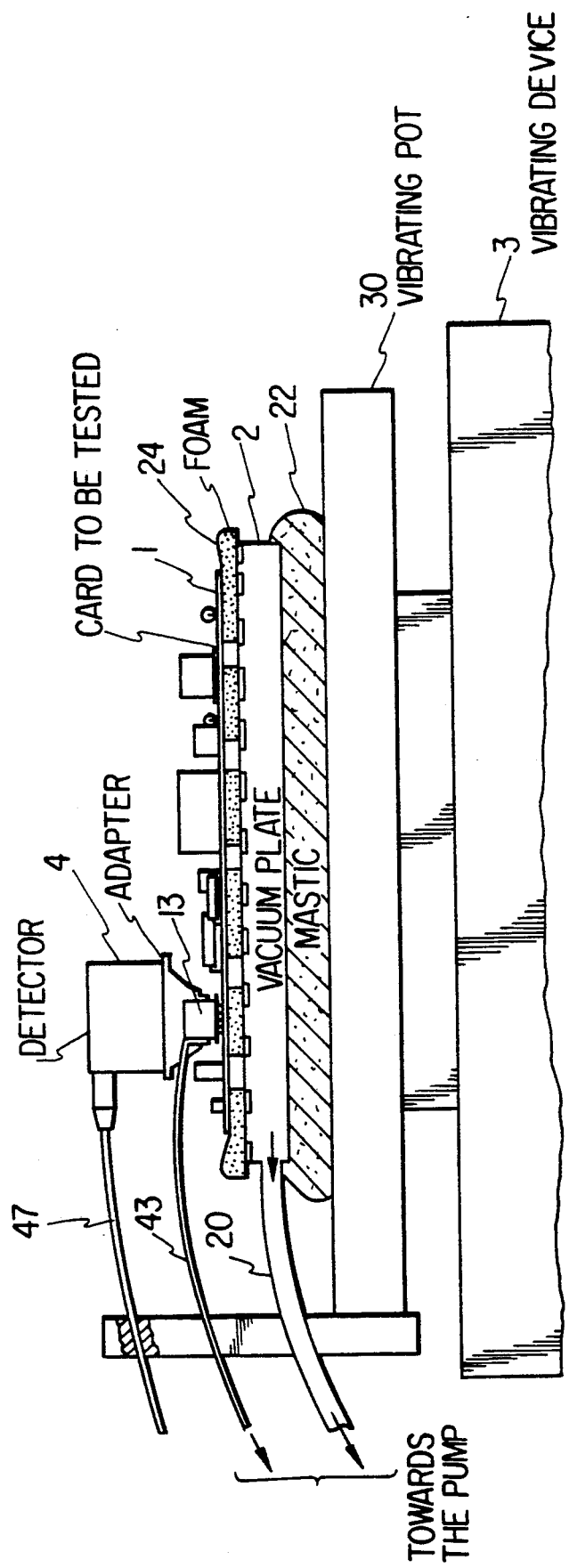
FIG. 8 shows the system of the invention assembled and ready for operation.
Figure 9:
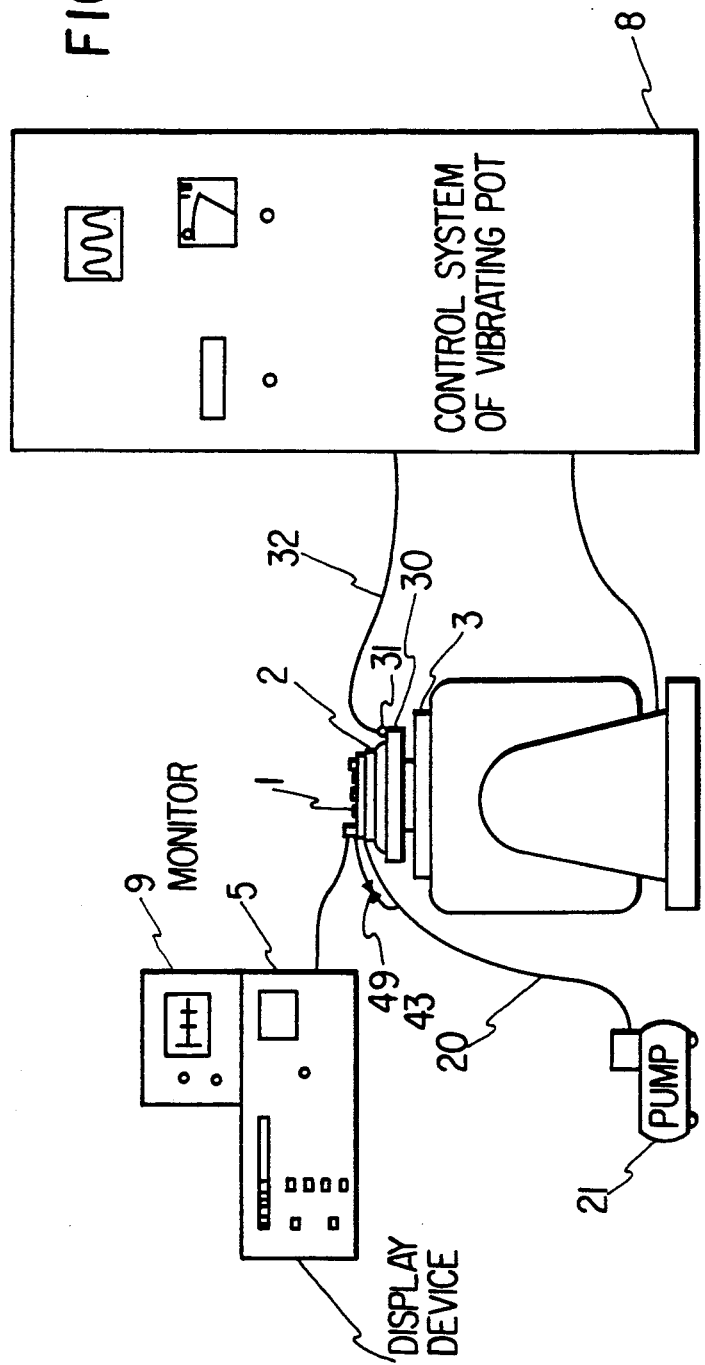
FIG. 9 shows a general installation allowing the invention to be put into practice.

To conduct a test on card components by means of such a system, the following procedure is adopted, by using the installations of FIGS. 8 and 9.

As shown in FIG. 8, the card is placed on the assembly of the system described above.

The card is fastened by means of a pneumatic device (FIG. 2). This device consists of a metal box (vacuum plate), the open-work upper face of which is covered with, for example, a perforated pad of neoprene foam, on which the card is placed.

When the pump 21 is put into operation (FIG. 9), the vacuum generated inside the plate 2 is transmitted through the perforations of the foam 24 and sucks the card to be tested 1 which is thereby made integral with the assembly as a whole. This vacuum plate is itself held on the stage 30 of the vibrating pot by means of a wafer of mastic 22.

This device allows easy and secure fastening, whilst at the same time avoiding resonances and any stress liable to damage the card or make it fragile.

The plate 2 can be chosen according to the particular card to be tested.

The foam pad can likewise be cut out and perforated according to the particular card. As an example, the thickness of the foam pad can be 5 to 6 mm and can have dimensions larger than those of the card of 5 mm. The holes will be made by means of the hollow punch of a diameter of 5 to 10 mm and will be distributed regularly over the pad.

Before the tests, a check of the resulting acceleration in the region of the card will be carried out by the stroboscopic measurement of its movement. The level of excitation applied to the vibrating pot will be adjusted so as not to exceed the requisite value (for example, 10 g) for the testing of the card.

Moreover, this check will make it possible to be sure of the firmness of the pneumatic fastening of the card and of the absence of resonance in the system.

For the entire duration of the tests, an accelerometric measuring chain will make it possible to monitor the level of excitation of the stage of the vibrating pot by means of the accelerometer 31 of the control unit 8.

Subsequently, for each component the test sequence will be as follows:

Wetting the upper face of the component to be tested with a drop of corrplant.

Placing the piezo-acoustic sensor 4 equipped with its adaptor piece 41 onto the component. The suction is activated, and the adaptor descends and is laid onto the upper face of the component. Suction can be carried out by the same pipe 21 as before and a valve 49.

Making sure that the background noise observed on the monitor is below a limiting value. Otherwise, looking for possible air leaks in the region of the card 1 or of the adaptor piece 41.

Cleaning the card by blowing with dry nitrogen.

Selecting the exciting frequency of the vibrating pot 3. Allowing for the height of the cavity of the component housings, a fixed frequency, for example of between 60 and 70 Hz, will be selected.

Applying the exciting signal to the vibrating pot, progressively increasing the level up to the requisite peak value of, for example, 10 g.

Making sure that the signal present on the monitor 9 of the detection chain does not have a form and sequence characteristic of incorrect contact or a mechanical disturbance (cable, pumping pipes).

If no impact characteristic of the presence of a particle is observed on the monitor 9, imparting a shock to the body of the adaptor by means of a copper rod on the bracket 46, as shown in FIG. 5. Observing and listening for possible impacts of particles immediately after this shock.

In the absence of any impact, repeating this sequence.

In the event of confirmed detection or in the absence of an impact, after for example five shocks, (progressively) stopping the excitation of the vibrating pot.

After cutting off the suction of the adaptor piece 41, passing to the next component and repeating the same sequence.

When all the components of a card have been tested, stopping the pump 21 of the pneumatic fastening device.

The assembly thus described has been tested successfully on prototypes serving for preliminary trials, but above all on components of which the inherent pollution is of the same type as that of components to be located on cards.

It is clear that the aforegoing description has been given only by way of non-limiting example. Other alternative versions can be considered, without departing from the scope of the invention. The numerical examples were given only to illustrate the description

We claim:

1. A system for detecting free particles in at least one component housing assembled on a printed-circuit card, which comprises,
    a vibrating stage;
    vacuum-generating means fixed to the vibrating stage, carrying the printed-circuit card on one of its faces and holding said card in position as a result of the generated vacuum; and
    at least one piezo-acoustic detector which is coupled acoustically to said at least one component housing.

2. A system according to claim 1, wherein the vacuum-generating means comprise a hollow part having a plane face for applying the card to it, said plane face having one or more orifices communicating with a cavity of the hollow part, the latter also having an air access making it possible to generate a vacuum in the cavity of the hollow part.

3. A system according to claim 2, which comprises a pad located between the card and the plane face of the hollow part, wherein said pad comprises a soft material, having one or more holes, each corresponding to at least one orifice of the hollow body.

4. A system according to claim 2, wherein the plane face has a plurality of orifices arranged regularly.

5. A system according to claim 3, wherein the soft material has holes arranged according to the particular card, so as not to correspond to holes in the card.

6. A system according to claim 2, which comprises a pump connected to the air access so as to generate a vacuum in the hollow part.

7. A system according to claim 2, which comprises a layer of deformable material located between the hollow part and the vibrating stage for transmitting vibrations to the component housing.

8. A system according to claim 1, which comprises an accelerometer connected to at least one of the vibrating stage and the vacuum means for measuring vibrational accelerations to which the card is subjected, and supplying an acceleration measurement signal, and vibration control means for receiving the acceleration measurement signal and controlling vibration of the vibrating stage accordingly.

9. A system according to claim 1, wherein the piezo-acoustic detector comprises an adaptor piece adaptable to at least one component and having means for fixing the detector to said at least one component housing.

10. A system according to claim 9, wherein the fixing means comprises claws for attaching the adaptor piece to the at least one component housing to be tested.

11. A system according to claim 9, wherein the adaptor piece has an orifice reaching an interface which comprises the end of the adaptor piece and of the upper face of the component, and pumping means connected to said orifice for generating a vacuum in said interface and causing the adaptor piece to be laid against said at least one component housing.

12. A system according to claim 11, which comprises a sealing flange for ensuring sealing between the adaptor piece and the at least one component housing.

13. A system according to claim 1, which comprises a processing device for receiving a measurement signal from the piezo-acoustic detector and supplying a display signal to a display device.

14. A system according to claim 1, wherein the piezo-acoustic detector includes means for imparting shocks which are transmitted by means of the piezo-acoustic detector to the component to be tested.

15. A method for detecting free particles in one or more components assembled on a printed-circuit card, which comprises:
    generating a vacuum between a vibrating stage and the printed circuit card so as to hold the printed circuit card;
    vibrating the printed-circuit card on the vibrating stage and
    measuring sound impacts on the walls of each component by the acoustic coupling of at least one piezo-acoustic detector to one or more components.

16. A method according to claim 15, which comprises imparting before the impact-measuring step one or more shocks to each component, so as to detach possible free particles in each component.

* * * * *